(12) United States Patent
Jhon et al.

(10) Patent No.: US 10,700,278 B2
(45) Date of Patent: Jun. 30, 2020

(54) FOUR-OR-MORE-COMPONENT-BASED CHALCOGENIDE PHASE-CHANGE MATERIAL AND MEMORY DEVICE COMPRISING THE SAME

(71) Applicant: KOREA INSTITUTE OF SCIENCE AND TECHNOLOGY, Seoul (KR)

(72) Inventors: Young Min Jhon, Seoul (KR); Yong Tae Kim, Seoul (KR); Chun Keun Kim, Seoul (KR); Young-Hwan Kim, Seoul (KR); Minho Choi, Seoul (KR); Sehyun Kwon, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 28 days.

(21) Appl. No.: 16/201,295

(22) Filed: Nov. 27, 2018

(65) Prior Publication Data

US 2020/0083445 A1    Mar. 12, 2020

(30) Foreign Application Priority Data

Sep. 7, 2018    (KR) .......................... 10-2018-0107352

(51) Int. Cl.
*H01L 45/00*    (2006.01)
*H01L 27/24*    (2006.01)

(52) U.S. Cl.
CPC ........ *H01L 45/144* (2013.01); *H01L 27/2481* (2013.01); *H01L 45/06* (2013.01)

(58) Field of Classification Search
CPC .................................................... H01L 45/144
See application file for complete search history.

(56) References Cited

FOREIGN PATENT DOCUMENTS

| JP | 02167788 A | * | 6/1990 | ............ G11B 7/243 |
| KR | 1020100098133 A | | 9/2010 | |
| KR | 1020150042654 A | | 4/2015 | |

OTHER PUBLICATIONS

English abstract of JP-02167788-A (Year: 1990).*
[Supportive Materials for Exception to Loss of Novelty]Minho Choi et al., "Effects of Y Dopant on Lattice Distortion and Electrical Properties of In3SbTe2 Phase-Change Material", Physical Status Solid RRL, Sep. 20, 2017, 5 pages, vol. 11, No. 1700275.
Minho Choi et al., "Lattice Distortion in In3SbTe2 Phase Change Material with Substitutional Bi," Scientific Reports, Aug. 2015, 9 pages, vol. 5.
Korean Office Action for KR Application No. 10-2018-0107352 dated Feb. 18, 2020.

* cited by examiner

*Primary Examiner* — Peter F Godenschwager
(74) *Attorney, Agent, or Firm* — Cantor Colburn LLP

(57) ABSTRACT

The present invention provides a chalcogenide phase-change material represented by the following Chemical Formula 1, and a memory device including the same.

$$M_a(A_xSb_yTe_{(1-x-y)})_b$$ [Chemical Formula 1]

In Chemical Formula 1, M denotes an element having a doping formation energy $\Delta E_f$ in a range of −3 eV/atom to 0.5 eV/atom, A denotes indium (In) or germanium (Ge), a and b are each positive numbers and selected to satisfy a+b=1, x ranges from 0.15 to 0.3, and y ranges from 0.05 to 0.25.

9 Claims, 11 Drawing Sheets
(11 of 11 Drawing Sheet(s) Filed in Color)

FOUR-OR-MORE-COMPONENT-BASED CHALCOGENIDE PHASE-CHANGE MATERIAL AND MEMORY DEVICE COMPRISING THE SAME

CROSS-REFERENCE TO RELATED APPLICATION

This application claims priority to and the benefit of Korean Patent Application No. 2018-0107352, filed on Sep. 7, 2018, the disclosure of which is incorporated herein by reference in its entirety.

BACKGROUND

1. Field of the Invention

The present invention relates to a four-or-more-component-based chalcogenide phase-change material and a memory device including the same.

2. Discussion of Related Art

Chalcogenide materials have been actively studied for optical discs such as compact discs (CDs), digital video discs (DVDs), Blu-ray discs, and the like, non-volatile memories, neuromorphic systems, three-dimensional (3D) cross point memories, and the like. In order to improve performance of such devices, development of chalcogenide materials that can realize a high phase transition speed and low power consumption is an important research field.

A rapid phase change of a chalcogenide material can enable a rapid operation in a device, and thermodynamic stability of the chalcogenide material can enable reduction in phase separation and element separation caused by numerous repeated phase transition between crystalline and amorphous states. Until now, most studies on $Ge_2Sb_2Te_5$ (hereinafter, referred to as GST), $In_3SbTe_2$ (hereinafter, referred to as IST), $Sb_3Te$, GeTe, and the like have been conducted to improve material properties and electrical properties of materials by changing a chemical composition or by using a doping method. However, which element can be used as a most appropriate dopant to constitute a four-or-more-component-based material cannot be known, a relationship between the dopant and the characteristic of chalcogenide cannot be clearly explained, and an optimal material cannot be found.

In view of phase change memory, most materials, as well as GeSbTe-based alloys and InSbTe-based alloys, which have been studied recently, have some disadvantages to being directly applied as phase change memories.

For example, GeSbTe-based materials have a somewhat low crystallization temperature of about 150° C., a high melting temperature, and low thermal stability. This causes a problem of a resistance drift phenomenon due to inter-cell thermal interference and phase separation and element separation phenomena caused by numerous operations, thereby lowering reliability.

Further, InSbTe-based materials have a problem in that a SET operation, which causes a phase change from an amorphous phase to a crystalline phase due to a somewhat high crystallization temperature of about 300° C., is slowed down. In addition, the InSbTe-based materials have a problem in that a RESET operation, which causes a phase change from a crystalline phase to an amorphous phase due to a somewhat high melting temperature of about 630° C., is slowed down.

In conclusion, all of the most studied GeSbTe-based material and InSbTe-based material have many problems in being applied to phase-change memories, and thus it is necessary to develop improved chalcogenide materials.

[Document of Related Art]
[Patent Document]
(Patent Document 1) Korean Laid-open Patent Publication No. 10-2010-0098133

SUMMARY OF THE INVENTION

The present invention is directed to providing a four-or-more-component-based chalcogenide material in which a phase change is possible at a higher speed due to lattice distortion.

According to an aspect of the present invention, there is provided a chalcogenide phase-change material represented by the following Chemical Formula 1:

$$M_a(A_xSb_yTe_{(1-x-y)})_b \qquad \text{[Chemical Formula 1]}$$

In Chemical Formula 1, M denotes an element having a doping formation energy $\Delta E_f$ in a range of −3 eV/atom to 0.5 eV/atom, A denotes indium (In) or germanium (Ge), a and b are each positive numbers and selected to satisfy a+b=1, x ranges from 0.15 to 0.3, and y ranges from 0.05 to 0.25.

According to another aspect of the present invention, there is provided a memory device including the chalcogenide phase-change material.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
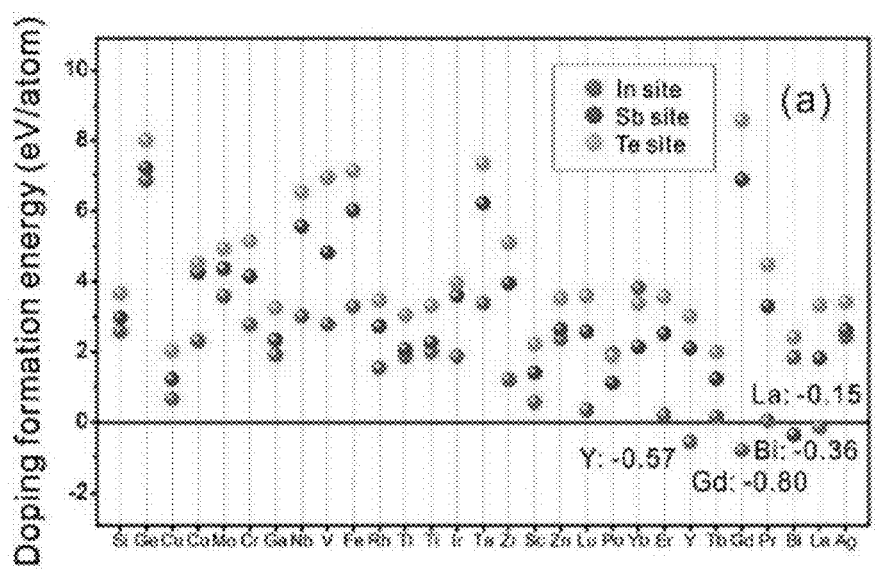
FIG. 1 is a graph showing calculated formation energies when $In_3SbTe_2$ (IST) is doped with 29 types of elements.

Embodiments of the present invention that are easily performed by those skilled in the art will be described in detail with reference to the accompanying drawings. The present invention may be embodied in several different forms and is not limited to embodiments described herein. Parts irrelevant to description are omitted in the drawings in order to clearly explain the present invention, and detailed descriptions of well-known technology will be omitted.

Throughout this specification, when a certain part "includes" a certain component, it means that another component may be further included, not excluding another component unless otherwise defined.

Hereinafter, the present invention will be described in detail.

The present inventors have made efforts to develop a material to overcome disadvantages of an $In_3SbTe_2$ (IST)-based material and a $Ge_2Sb_2Te_5$ (GST)-based material, which are existing three-component-based chalcogenide materials. As a result, the present inventors have developed a new chalcogenide phase-change material by causing a lattice distortion phenomenon in a chalcogenide material.

The lattice distortion phenomenon means that an atomic structure is distorted when a dopant is implanted into an IST-based material or a GST-based material. The lattice distortion phenomenon may be explained with an inter-plane distance and an inter-plane angle using transmission electron microscopy (TEM) data, and the possibility and effect thereof may be verified by comparing the TEM data with density functional theory (DFT) calculation data.

As described above, the present inventors have been able to select dopants appropriate for the IST-based material and the GST-based material, which are the existing three-component-based chalcogenide materials, in consideration of thermodynamic stability and/or angular distortion due to the atomic structure distortion. Accordingly, the present inventors have developed a new four-or-more-component-based chalcogenide phase-change material in which phase separation and element separation phenomena caused by repeated phase changes may be prevented. Specifically, in an embodiment of the present invention, a chalcogenide phase-change material represented by the following Chemical Formula 1 is provided.

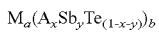 [Chemical Formula 1]

In Chemical Formula 1, M denotes an element having a doping formation energy $\Delta E_f$ in a range of $-3$ eV/atom to 0.5 eV/atom, A denotes indium (In) or germanium (Ge), a and b are each positive numbers and selected to satisfy a+b=1, x ranges from 0.15 to 0.3, and y ranges from 0.05 to 0.25.

In the chalcogenide phase-change material represented by the above Chemical Formula 1, M may be a dopant. Specifically, the element denoted by M needs to be a thermodynamically stable and reliable dopant in order to prevent phase separation and element separation phenomena caused by repeated phase changes.

As the element denoted by M in the above Chemical Formula 1, an appropriate element may be selected using a DFT calculation method in consideration of thermodynamic stability and distortion angle.

Specifically, the element denoted by M in the above Chemical Formula 1 may be an element having a doping formation energy (or a formation energy) $\Delta E_f$ of $-3$ eV/atom to 0.5 eV/atom. The IST-based material and the GST-based material may be doped with the element denoted by M and the element denoted by M may show the doping formation energy range. Therefore, the chalcogenide phase-change material may be thermodynamically stable and the phase separation phenomenon caused by repeated phase change processes may be minimized.

The doping formation energy is a value obtained by comparing formation energy values before and after doping when a specific site is doped with a specific element. The doping formation energy has a positive or negative value. The positive value means that the formation energy after the doping with the dopant is greater than the formation energy before the doping with the dopant, and the negative value means the opposite case. That is, when the doping formation energy value is positive, it means that the dopant is difficult to substitute for the existing element in the atomic structure of the existing material and the energy of the material is increased and thus becomes unstable. Further, when the doping formation energy value is negative, it means that the dopant may take a site of an element in the existing material and stably enter the atomic structure.

According to an embodiment of the present invention, the M in the above Chemical Formula 1 may be an element in which at least one of α, β, and γ, which are unit lattice angles in an IST or GST atomic structure, are changed by 1.3° to 10°. That is, the M may be an element in which the unit lattice angle may be changed as described above while satisfying the above-described doping formation energy value. When the A in the above Chemical Formula 1 is indium, the M may be an element in which at least one of α, β, and γ, which are unit lattice angles in the IST atomic structure, are changed by 1.3° to 10°. Further, when the A in the above Chemical Formula 1 is germanium, the M may be an element in which at least one of α, β, and γ, which are unit lattice angles in the GST atomic structure, are changed by 1.3° to 10°. The IST-based material and the GST-based material may be doped with the element denoted by M, and the element denoted by M may cause lattice distortion as in the above range, thereby enabling a rapid phase change of the chalcogenide phase-change material.

An example for the design of a chalcogenide phase-change material according to an embodiment of the present invention is as follows. For example, various elements may be substituted for sites of three types of atoms, which are sites of Ge, Sb, and Te in GST, and then doping formation energy values may be obtained. The elements with positive values may be excluded primarily using the obtained energy values. As a following process, an element with large lattice distortion in the atomic structure may be found. As the distortion is relatively increased, the rapid phase change effect may be maximized. In addition, a rapid and stable phase change may be confirmed by DFT and ab initio molecular dynamics (AIMD) simulation. A radial distribution function (RDF) graph may be obtained in which a degree of amorphization may be explained by the AIMD simulation. In addition, the lattice distortion due to the dopant may be confirmed by an experimental method using a TEM and compared with the simulation result. X-ray diffraction (XRD), X-ray photoelectron spectroscopy (XPS), and the like may be complementarily used to confirm whether other dopants undergo a substitution reaction with chalcogenide. However, a so-called DFT calculation method is used for the above-described DFT calculation. The DFT calculation method may be performed by various programs including Vienna Ab initio Simulation Package (VASP), Quantum opEn-Source Package for Research in Electronic Structure, Simulation, and Optimization (ESPRESSO), ABINIT, and Spanish Initiative for Electronic Simulations with Thousands of Atoms (SIESTA). The value of the distortion angle may be obtained by measuring not only the angular distortion in one unit cell but also a degree of distortion of the entire modeled structure.

According to an embodiment of the present invention, the M in the above Chemical Formula 1 may be at least one element selected from the group consisting of yttrium (Y), gadolinium (Gd), lanthanum (La), titanium (Ti), indium (In), copper (Cu), tin (Sn), zinc (Zn), and aluminum (Al). Specifically, the M in the above Chemical Formula 1 may be yttrium (Y), gadolinium (Gd), lanthanum (La), titanium (Ti), indium (In), copper (Cu), tin (Sn), zinc (Zn), or aluminum (Al).

In the above Chemical Formula 1, in order to find an appropriate element denoted by M, it is necessary to select a thermodynamically stable element when the element denoted by M is substituted. For example, in computational dopant screening, thermodynamic stability may be calculated by a formation energy calculation method when an element is substituted, and an appropriate element may be selected based on the calculated thermodynamic stability.

FIG. 1 is a graph showing calculated formation energies when IST is doped with 29 types of elements. According to FIG. 1, it can be seen that when IST is doped, four types of elements, Y (−0.57), Gd (−0.8), Bi (−0.36), and La (−0.15), have negative values of doping formation energy. That is, it can be determined that the four types of elements are thermodynamically stable when the four types of elements are substituted for the IST.

As a following process, the angular distortion occurs when the dopant undergoes a substitution reaction with the IST, and then the reasonable dopants can be selected with how much distortion has occurred.

Figure 2:
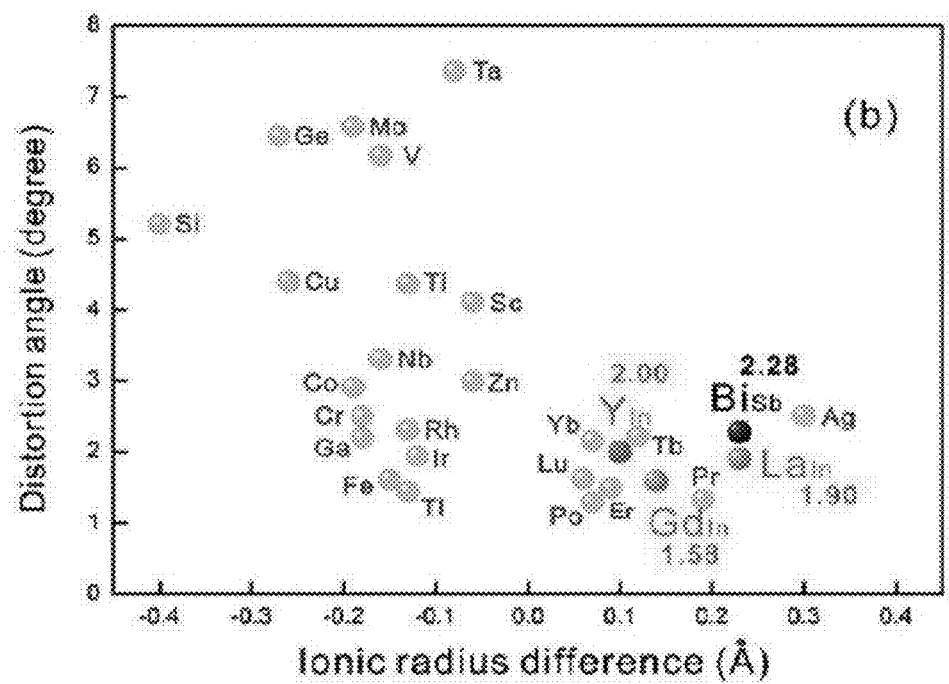
FIG. 2 is a graph showing distortion angles in an atomic structure when IST is doped with 29 types of elements.

FIG. 2 is a graph showing distortion angles in an atomic structure when IST is doped with 29 types of elements. FIG. 2 shows results of calculating the distortion angles by calculating a difference in ionic radius between a doped ion and a host ion using DFT calculation. Specifically, when the ionic radius of the dopant is relatively smaller than the ionic radius of the host ion, the difference between the ionic radii has a negative value and the distortion angles have larger values. When the host ion is substituted by a dopant with a smaller ionic radius, the substituted dopant tends to bond more closely with a nearby system and causes asymmetric lattice distortion. According to FIG. 2, among four thermodynamically stable elements, Y (2.00) has the greatest angular distortion value. Therefore, it can be determined that the element, Y, is the most appropriate element among the 29 candidates as a dopant. That is, in the IST, it can be determined that Y is an element satisfying both thermodynamic stability and large distortion angle.

Specifically, according to an embodiment of the present invention, the A in the above Chemical Formula 1 may be indium (In) and the M may be yttrium (Y), gadolinium (Gd), or lanthanum (La). Specifically, the A in the above Chemical Formula 1 may be indium (In) and the M may be yttrium (Y). Further, according to an embodiment of the present invention, the A in the above Chemical Formula 1 may be indium (In), the M may be yttrium (Y), gadolinium (Gd), or lanthanum (La), x may range from 0.35 to 0.65, and y may range from 0.05 to 0.25.

Figure 3:
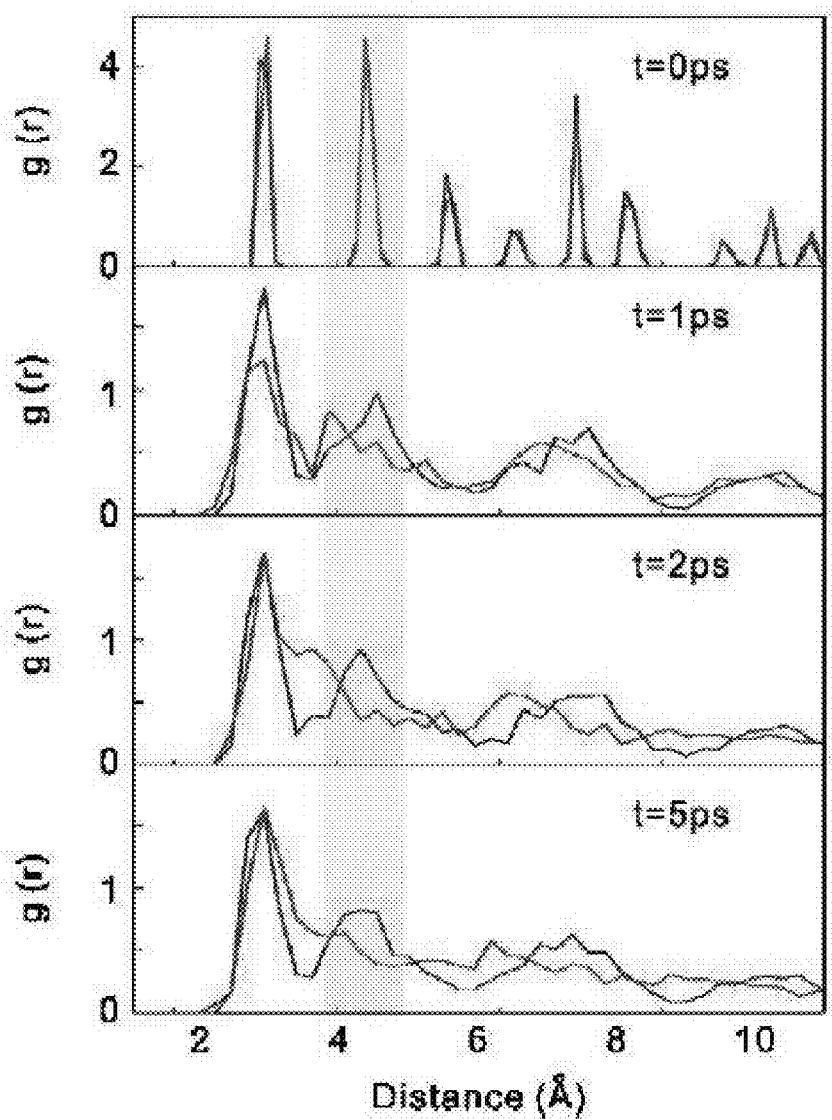
FIG. 3 shows calculated radial distribution functions (RDFs) of IST and Y-doped IST (Y-IST), which are simulated using ab initio molecular dynamics (AIMD)

FIG. 3 shows calculated RDFs of IST and Y-doped IST (Y-IST), which are simulated using AIMD. According to FIG. 3, as a result of calculating the RDFs using the AIMD for 0 to 5 picosecond at 1,200 K, it can be seen that a 2NN peak of Y-IST is significantly collapsed as compared to a peak of IST at high temperature and that the Y dopant promotes amorphization in the atomic structure of the IST. Further, as a result of calculating a difference in energy between crystalline and amorphous states, it can be seen that the energy of the Y-IST (0.18 eV atom$^{-1}$) is lower than the energy of the IST (0.26 eV atom$^{-1}$). That is, it can be seen that the Y-IST is amorphized more rapidly with less energy than the IST.

Figure 4:
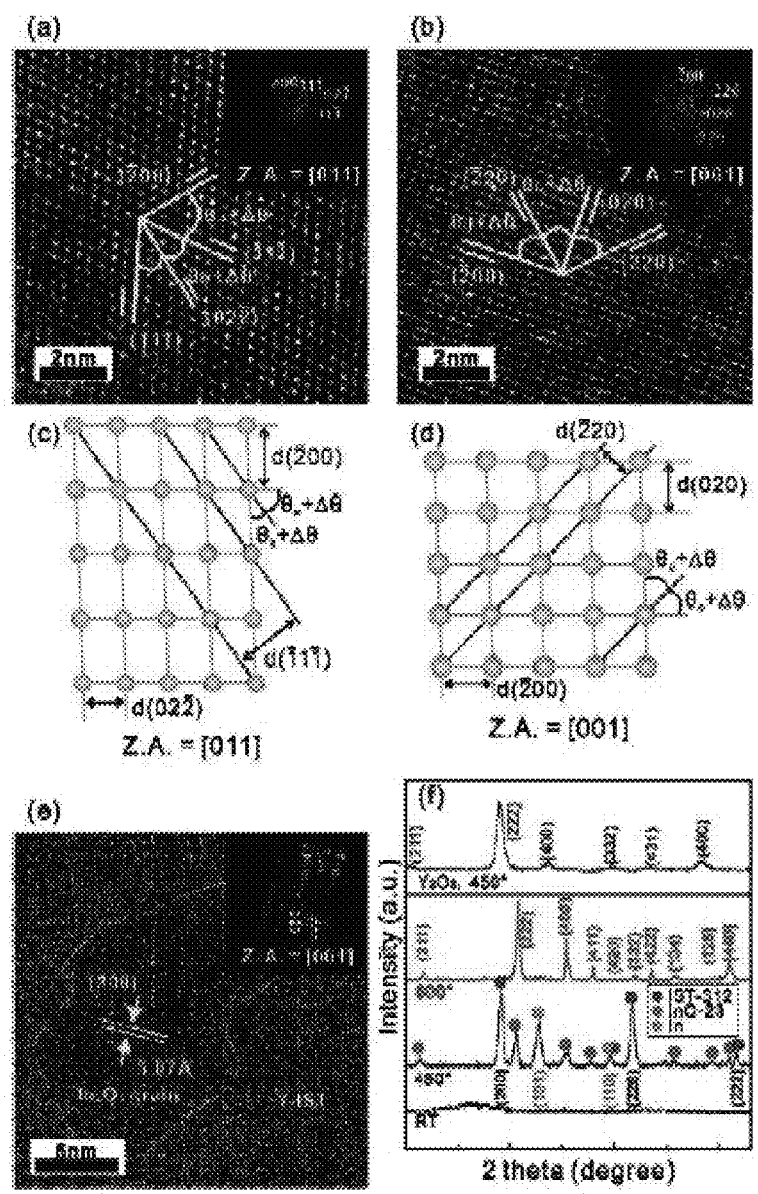
FIG. 4 shows results of analyzing lattice distortion of Y-IST through high-resolution transmission electron microscopy (HRTEM) images and X-ray diffraction (XRD) of Y-IST.

FIG. 4 shows results of analyzing lattice distortion of Y-IST through high-resolution TEM (HRTEM) images and XRD of Y-IST. The IST has a NaCl structure, and inter-plane angles, $\theta_a$, $\theta_b$, $\theta_c$, and $\theta_d$, are 54.74°, 35.26°, 45°, and 45°, respectively. A difference in inter-plane angle between the IST and the Y-IST ranges from about 0.25° to 1.98°. Indium (In) atoms do not react with oxygen in the IST structure. However, In substituted by Y reacts with oxygen to become $In_2O_3$. The Y-IST and a thin Y film are subjected to react with each other at 450° C. under an oxygen condition to confirm that the Y undergoes a substitution reaction with In in the IST structure. It can be seen, by the XRD analysis of FIG. 4F, that $In_2O_3$ is present on the IST but not $Y_2O_3$. This means that the Y atoms undergo a substitution reaction with the In atoms and the substituted In atoms react with oxygen to form $In_2O_3$. It can be seen that a grain of $In_2O_3$ is found in the Y-IST in the HRTEM image of FIG. 4E. As a result, it can be confirmed that the Y undergoes a substitution reaction with In in the IST structure.

Figure 5:
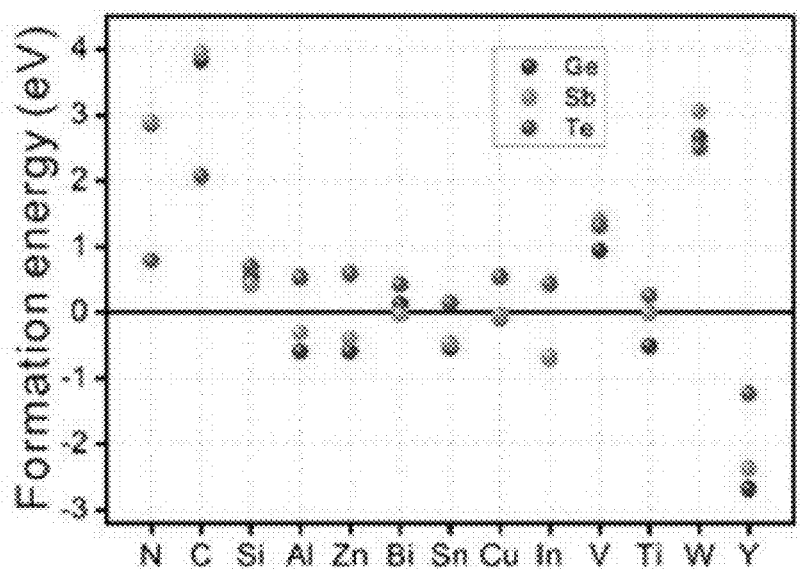
FIG. 5 is a graph showing calculated formation energies when $Ge_2Sb_2Te_5$ (GST) is doped with 13 types of elements.

FIG. 5 is a graph showing calculated formation energies when GST is doped with 13 types of elements. According to FIG. 5, it can be seen that when GST is doped, aluminum (Al), zinc (Zn), bismuth (Bi), tin (Sn), copper (Cu), indium (In), titanium (Ti), and yttrium (Y) have negative values of doping formation energy. That is, it can be determined that the eight types of elements are thermodynamically stable when the eight types of elements are substituted for the GST.

As a following process, the angular distortion occurs when the dopant undergoes a substitution reaction on the GST, and then and then the reasonable dopants can be selected with how much distortion has occurred.

Figure 6:
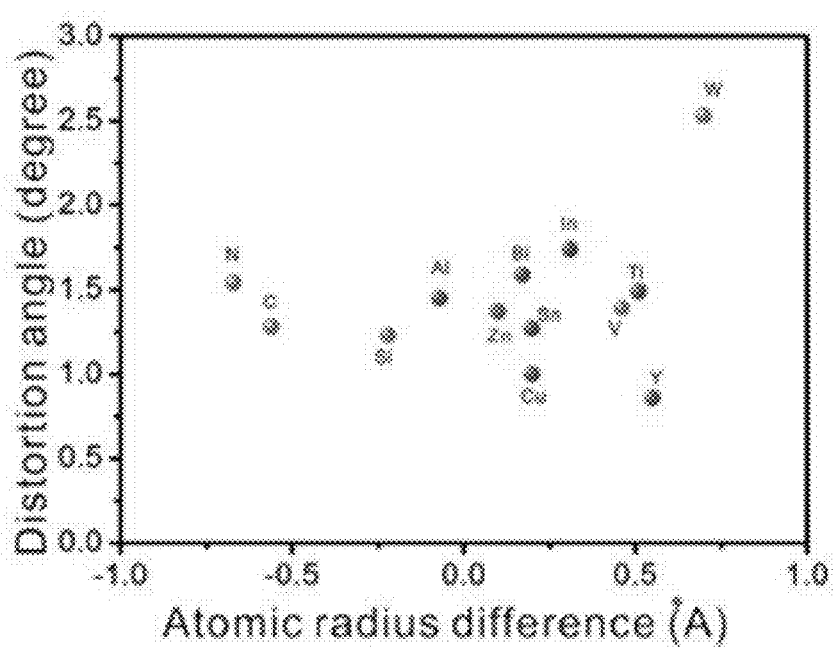
FIG. 6 is a graph showing distortion angles in an atomic structure when GST is doped with 13 types of elements.

FIG. 6 is a graph showing distortion angles in an atomic structure when GST is doped with 13 types of elements. FIG. 6 shows results of calculating the distortion angles by calculating a difference in ionic radius between a doped ion and a host ion using DFT calculation as in FIG. 2. According to FIG. 6, among four thermodynamically stable elements, Zn has the greatest angular distortion value. Therefore, it can be determined that the element, Zn, is the most appropriate element among the 13 candidates as a dopant.

Specifically, according to an embodiment of the present invention, the A in the above Chemical Formula 1 may be germanium (Ge) and the M may be yttrium (Y), titanium (Ti), indium (In), copper (Cu), tin (Sn), zinc (Zn), or aluminum (Al). Specifically, the A in the above Chemical Formula 1 may be germanium (Ge) and the M may be zinc (Zn). Further, according to an embodiment of the present invention, the A in the above Chemical Formula 1 may be germanium (Ge), the M may be yttrium (Y), titanium (Ti), indium (In), copper (Cu), tin (Sn), zinc (Zn), or aluminum (Al), x may range from 0.15 to 0.3, and y may range from 0.15 to 0.3.

Furthermore, as a result of simulation of Zn-doped GST (Zn-GST) using AIMD, it can be confirmed that the Zn-GST is more rapidly amorphized than the GST material.

Figure 7:
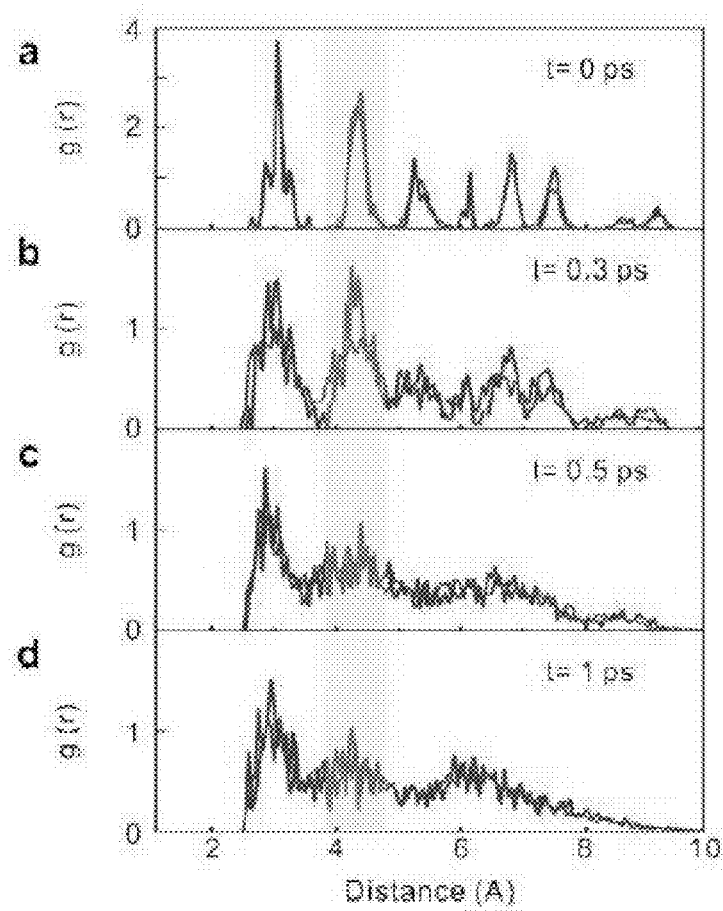
FIG. 7 shows calculated RDFs of GST and Zn-doped GST (Zn-GST), which are simulated using AIMD.

FIG. 7 shows calculated RDFs of GST and Zn-GST, which are simulated using AIMD. According to FIG. 7, as a result of calculating the RDFs using the AIMD for 0 to 1 picosecond at 900 K, it can be confirmed that the amorphization time is reduced when zinc is doped.

Figure 8:
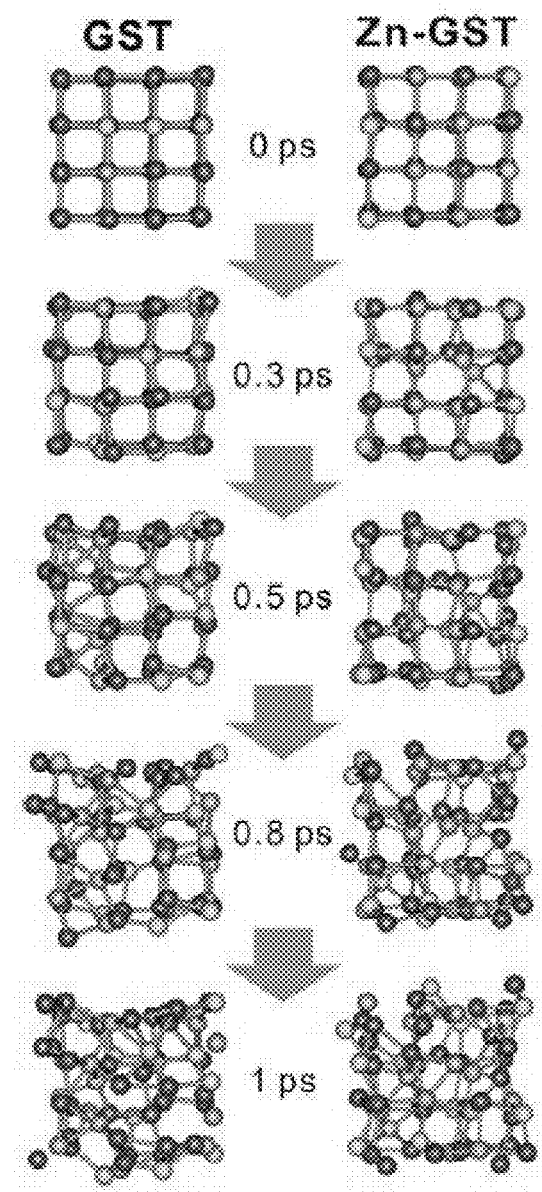
FIG. 8 shows structural changes of GST and Zn-GST, which are simulated using AIMD.

FIG. 8 shows structural changes of GST and Zn-GST, which are simulated using AIMD. In FIG. 8, when heat is applied to the GST and Zn-GST structures, zinc atoms of the Zn-GST are primarily moved and leave their positions first.

As a result, it can be seen that nearby atoms are affected and amorphization of the Zn-GST is accelerated compared to the GST.

The doping elements appropriate for the IST-based material and the GST-based material may be found through such a process, and the generated materials resulting from the doping may be represented by the above-described Chemical Formula 1. This reflects, when a dopant (M) appropriate for IST or GST is doped, which sites are substituted for those of In (or Ge), Sb, and Te, and the fact that a stoichiometric composition may vary according to the doped amount and the resulting vacancy.

Furthermore, according to an embodiment of the present invention, the a in the above Chemical Formula 1 may be more than 0 and 0.3 or less. Specifically, when the M in the above Chemical Formula 1 is one element, the a may be more than 0 and 0.15 or less, and when the M in the above Chemical Formula 1 is two elements, the a may be more than 0 and 0.3 or less.

In another embodiment of the present invention, a memory device including the chalcogenide phase-change material is provided. Specifically, the memory device may be a phase-change memory device, a neuromorphic memory device, a three-dimensional (3D) cross point memory device, or a multi-level memory device.

Since the memory device is applicable to a structure of a memory device known in the art except for applying the chalcogenide phase-change material according to the present invention thereto, a detailed description of the memory device will be omitted.

Hereinafter, embodiments of the present invention will be described in detail. However, the embodiments of the present invention may be modified in several different forms, and the scope of the present invention is not limited to the embodiments to be described below. The embodiments of the present invention are provided to fully explain the invention for those skilled in the art.

EMBODIMENT

An IST target and a Y target were simultaneously sputtered to form a Y-IST thin film on a SiO$_2$/Si substrate. A content and thickness of Y were controlled by RF power and deposition time. The content of Y in Y-IST was 12.38 at. % and the thickness was about 100 nm. The sputtering process was performed in an Ar atmosphere of 5 mTorr.

Further, under the same conditions, an IST target and a La target were simultaneously sputtered to form a La-IST thin film having a La content of 11.84 at. % on the SiO$_2$/Si substrate. Furthermore, an IST target and a Gd target were simultaneously sputtered to form a Gd-IST thin film having a Gd content of 12.65 at. % on the SiO$_2$/Si substrate.

Figure 9:
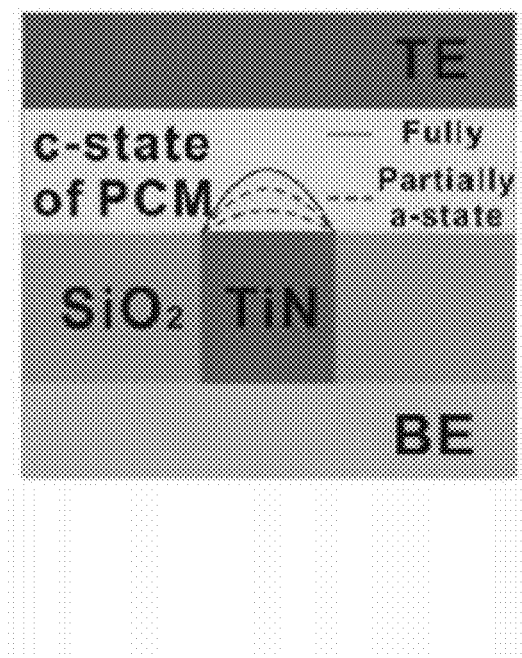
FIG. 9 is a schematic diagram of a structure of a phase-change random access memory (PRAM) according to an embodiment.

For the formation of a control group, under the same conditions, an IST target was sputtered to form an IST thin film on the SiO$_2$/Si substrate. Further, a GST target was sputtered to form a GST thin film on the SiO$_2$/Si substrate. A phase-change random access memory (PRAM) having a structure as shown in FIG. 9 was fabricated using Y-IST, La-IST, Gd-IST, IST, and GST prepared above. In the PRAM, TiN was used as a bottom electrode (BE), the prepared Y-IST, La-IST, Gd-IST, IST, and GST were positioned on the TiN, and TiN/Ti was used as a top electrode (TE) on the prepared Y-IST, La-IST, Gd-IST, IST, and GST. A contact area of the PRAM was 250 nm×250 nm.

Characteristics of a PRAM cell device were measured using a Keithley 4200-SCS semiconductor characterization system, a Keithley 3402 pulse/pattern generator, a 4225-PMU ultra-fast I-V module, a Keithley 4225-RPM remote amplifier/switch, and a Keithley 3402 pulse/pattern generator. A SET speed and a RESET speed were measured after various SET and RESET pulses were generated.

Figure 10:
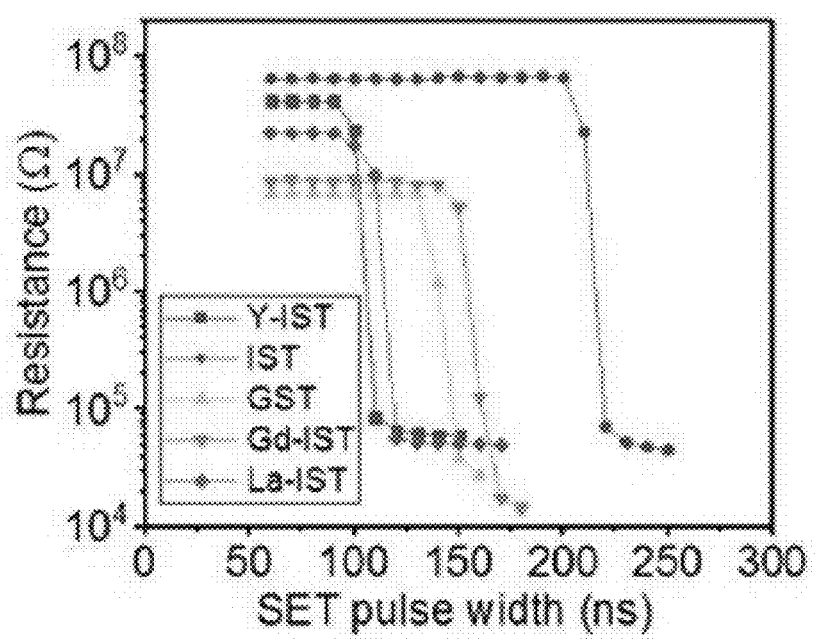
FIGS. 10 and 11 are graphs respectively showing SET and RESET pulses of a PRAM according to an embodiment.
Figure 11:
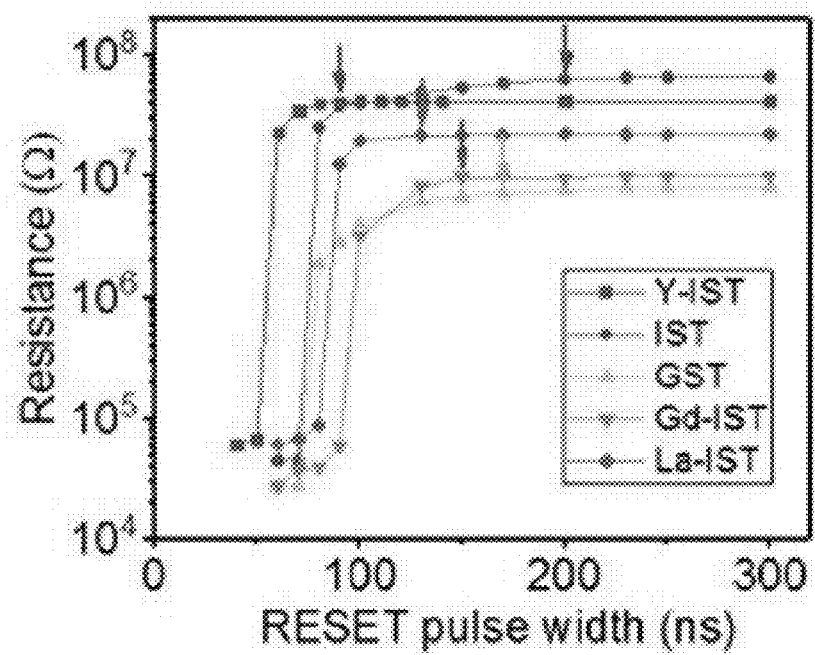

FIGS. 10 and 11 are graphs respectively showing SET and RESET pulses of a PRAM according to an embodiment. Specifically, threshold voltages in the Y-IST, Gd-IST, La-IST, IST, and GST were 1.83 V, 1.90 V, 1.88 V, 1.95 V, and 1.91 V, respectively. Further, the Y-IST was crystallized at about 100 ns and was twice as short as the IST (220 ns). This means that the speed for SET becomes faster. It can be confirmed that even when not only Y but also Gd and La are doped, the SET and RESET speeds become faster than the IST. The RESET was measured with a pulse of 60 ns to 300 ns at 5 V and a width of 10 ns. It can be confirmed that the RESET pulses of the Y-IST, Gd-IST, and La-IST are 90 ns, 150 ns, and 130 ns, respectively, and better results than GST (170 ns) and IST (230 ns) are obtained.

In this specification, TEM analysis was performed using a 300 kV FBI TITAN instrument to measure a bright-field TEM (BFTEM) image, a HRTEM image and a fast-Fourier transform (FFT). Further, the samples were thermally treated at each temperature by a rapid thermal annealing (RTA) process and mechanically polished. Diffraction patterns were analyzed using XRD according to a crystallization temperature and a phase-change temperature.

The chalcogenide phase-change material according to the embodiment of the present invention can be thermodynamically stable as compared with IST and GST, which are the conventional three-component-based chalcogenide materials, and a rapid operation speed in a device can be realized through rapid phase change. Further, in the chalcogenide phase-change material according to the embodiment of the present invention, low power driving of the device can be realized by a low threshold voltage.

Furthermore, in the chalcogenide phase-change material according to the embodiment of the present invention, phase separation and element separation phenomena can be minimized in comparison with the conventional three-component-based chalcogenides IST and GST, and thus it is possible to increase the phase-change material persistence and operation repeatability.

What is claimed is:

1. A chalcogenide phase-change material represented by the following Chemical Formula 1:

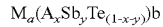  [Chemical Formula 1]

$$M_a(A_xSb_yTe_{(1-x-y)})_b$$

In Chemical Formula 1,
M denotes an element having a doping formation energy ΔEf in a range of −3 eV/atom to 0.5 eV/atom,
A denotes indium (In) or germanium (Ge),
a and b are each positive numbers and selected to satisfy a+b=1,
x ranges from 0.15 to 0.3, and
y ranges from 0.05 to 0.3.

2. The chalcogenide phase-change material of claim 1, wherein the M in the above Chemical Formula 1 is an element in which at least one of α, β, and γ, which are unit lattice angles of In$_3$SbTe$_2$ or Ge$_2$Sb$_2$Te$_5$ atomic structure, are changed by 1.3° to 10°.

3. The chalcogenide phase-change material of claim 1, wherein the M in the above Chemical Formula 1 is at least one element selected from the group consisting of yttrium (Y), gadolinium (Gd), lanthanum (La), titanium (Ti), indium (In), copper (Cu), tin (Sn), zinc (Zn), and aluminum (Al).

4. The chalcogenide phase-change material of claim 1, wherein:

the A in the above Chemical Formula 1 is indium (In); and
the M is yttrium (Y), gadolinium (Gd), or lanthanum (La).

5. The chalcogenide phase-change material of claim 1, wherein:
the A in the above Chemical Formula 1 is germanium (Ge); and
the M is yttrium (Y), titanium (Ti), indium (In), copper (Cu), tin (Sn), zinc (Zn), or aluminum (Al).

6. The chalcogenide phase-change material of claim 5, wherein:
the x in the above Chemical Formula 1 ranges from 0.15 to 0.3; and
the y ranges from 0.15 to 0.3.

7. The chalcogenide phase-change material of claim 1, wherein the a in the above Chemical Formula 1 is more than 0 and 0.3 or less.

8. A memory device comprising the chalcogenide phase-change material according to claim 1.

9. The memory device of claim 8, wherein the memory device is a phase-change memory device, a neuromorphic memory device, a three-dimensional (3D) cross point memory device, or a multi-level memory device.

\* \* \* \* \*